United States Patent
Kobayashi et al.

(10) Patent No.: US 12,207,416 B2
(45) Date of Patent: Jan. 21, 2025

(54) COMPONENT MOUNTER

(71) Applicant: FUJI CORPORATION, Chiryu (JP)

(72) Inventors: Takahiro Kobayashi, Chiryu (JP); Kazuya Kotani, Toyota (JP)

(73) Assignee: FUJI CORPORATION, Chiryu (JP)

(*) Notice: Subject to any disclaimer, the term of this patent is extended or adjusted under 35 U.S.C. 154(b) by 348 days.

(21) Appl. No.: 17/904,489

(22) PCT Filed: Feb. 21, 2020

(86) PCT No.: PCT/JP2020/006997
§ 371 (c)(1),
(2) Date: Aug. 18, 2022

(87) PCT Pub. No.: WO2021/166211
PCT Pub. Date: Aug. 26, 2021

(65) Prior Publication Data
US 2023/0106149 A1    Apr. 6, 2023

(51) Int. Cl.
*H05K 13/08* (2006.01)
*G06V 10/60* (2022.01)
*H05K 13/04* (2006.01)

(52) U.S. Cl.
CPC ......... *H05K 13/0812* (2018.08); *G06V 10/60* (2022.01); *H05K 13/0409* (2018.08); *H05K 13/041* (2018.08); *H05K 13/086* (2018.08)

(58) Field of Classification Search
CPC .......... H05K 13/0812; H05K 13/0409; H05K 13/041; H05K 13/086; H05K 13/0813; H05K 13/043; G06V 10/60
See application file for complete search history.

(56) References Cited

U.S. PATENT DOCUMENTS

| | | | |
|---|---|---|---|
| 11,266,051 B2* | 3/2022 | Ishikawa | H05K 13/0812 |
| 2006/0075631 A1* | 4/2006 | Case | H05K 13/0812 29/721 |
| 2021/0144894 A1* | 5/2021 | Kotani | H05K 13/0812 |

FOREIGN PATENT DOCUMENTS

| | | |
|---|---|---|
| EP | 4 081 010 A1 | 10/2022 |
| JP | 2011-114084 A | 6/2011 |
| WO | WO-2021124386 A1 * | 6/2021 ........... G06T 1/0007 |

OTHER PUBLICATIONS

International Search Report Issued Apr. 21, 2020, in PCT/JP2020/006997, filed on Feb. 21, 2020, therein, 2 pages.

* cited by examiner

Primary Examiner — Roy M Punnoose
(74) Attorney, Agent, or Firm — Oblon, McClelland, Maier & Neustadt, L.L.P.

(57) ABSTRACT

A component mounter includes a state recognition section configured to recognize a supply state of a component in a supply area based on a feature amount including at least one of a shape and an angle of each of multiple feature portions in image data on which image processing has been executed. The state recognition section determines whether one or more candidate feature portions included in a search range belong to an identical component together with a reference feature portion based on one of feature amounts of the candidate feature portion and a positional relationship between the reference feature portion and the candidate feature portion.

14 Claims, 8 Drawing Sheets

COMPONENT MOUNTER

TECHNICAL FIELD

The present description relates to a component mounter.

BACKGROUND ART

A component mounter executes a mounting process of mounting components supplied by a bulk feeder or the like on a board. Bulk feeders are used to supply components accommodated in a bulk state. As shown in Patent Literature 1, there is a type of bulk feeder configured to supply components in a bulk state in which the components are scattered to a supply area where a suction nozzle can pick up the components. In a mounting process, the component mounter executes image processing for recognizing a supply state of components by a bulk feeder, and controls the pickup operation of the components by a suction nozzle based on the results of the image processing.

PATENT LITERATURE

Patent Literature 1: JP-A-2011-114084

BRIEF SUMMARY

Technical Problem

In a PP cycle (a pick-and-place cycle) which is repeatedly executed by a component mounter in a mounting process, there may be a case in which multiple components are picked up by multiple suction nozzles supported on a mounting head from a supply area of a bulk feeder. For this mounting process, it is desired to improve the efficiency and precision of the image processing for recognizing the supply state of components by the bulk feeder in the supply area.

An object of the present description is to provide a component mounter configured to deal with a configuration in which multiple components are supplied in a bulk state so as to improve the efficiency and precision of recognition processing of a supply state which is executed in the PP cycle.

Solution to Problem

The present description discloses a component mounter, including:
 a camera configured to image a supply area where multiple components are supplied in a bulk state;
 an image processing section configured to execute on image data acquired through imaging by the camera image processing for distinguishing areas of multiple feature portions of each of the components from areas other than the multiple feature portions in the image data based on brightness; and
 a state recognition section configured to recognize a supply state of each of the components in the supply area based on a feature amount including at least one of a shape and an angle of each of the multiple feature portions of each of the components in the image data on which the image processing is executed,
 wherein one of the multiple feature portions in the image data on which the image processing is executed is defined as a reference feature portion, and another of the multiple feature portions which is included in a predetermined search range which is determined based on a position and the feature amount of the reference feature portion is defined as a candidate feature portion which can belong to an identical component of the multiple components together with the reference feature portion, and
 wherein the state recognition section determines whether the candidate feature portion belongs to the identical component together with the reference feature portion based on either of the feature amount or feature amounts of one or more the candidate feature portions which are included in the search range and a positional relationship between the reference feature portion and the candidate feature portion.

Advantageous Effects

With such a configuration, since the predetermined search range which is determined based on the position and the feature amount of the reference feature is targeted for search when searching for the candidate feature portion, the efficiency of search processing can be improved. Further, since the determination on whether the candidate feature portion belongs to the identical component together with the reference feature portion is made based on the feature amount or the positional relationship with the reference feature portion on the multiple candidate feature portions, an erroneous recognition of an identical component can be prevented from being made based on feature portions of a different component. As a result, the precision of the recognition processing of a supply state can be improved.

DESCRIPTION OF EMBODIMENTS

1. Configuration of Component Mounter 10

Component mounter 10 makes up a production line for producing board products together with multiple types of board work machines including, for example, another component mounter 10. The board work machines which make up the production line can include a printer, an inspection device, a reflow furnace, and the like.

1-1. Board Conveyance Device

Figure 1:
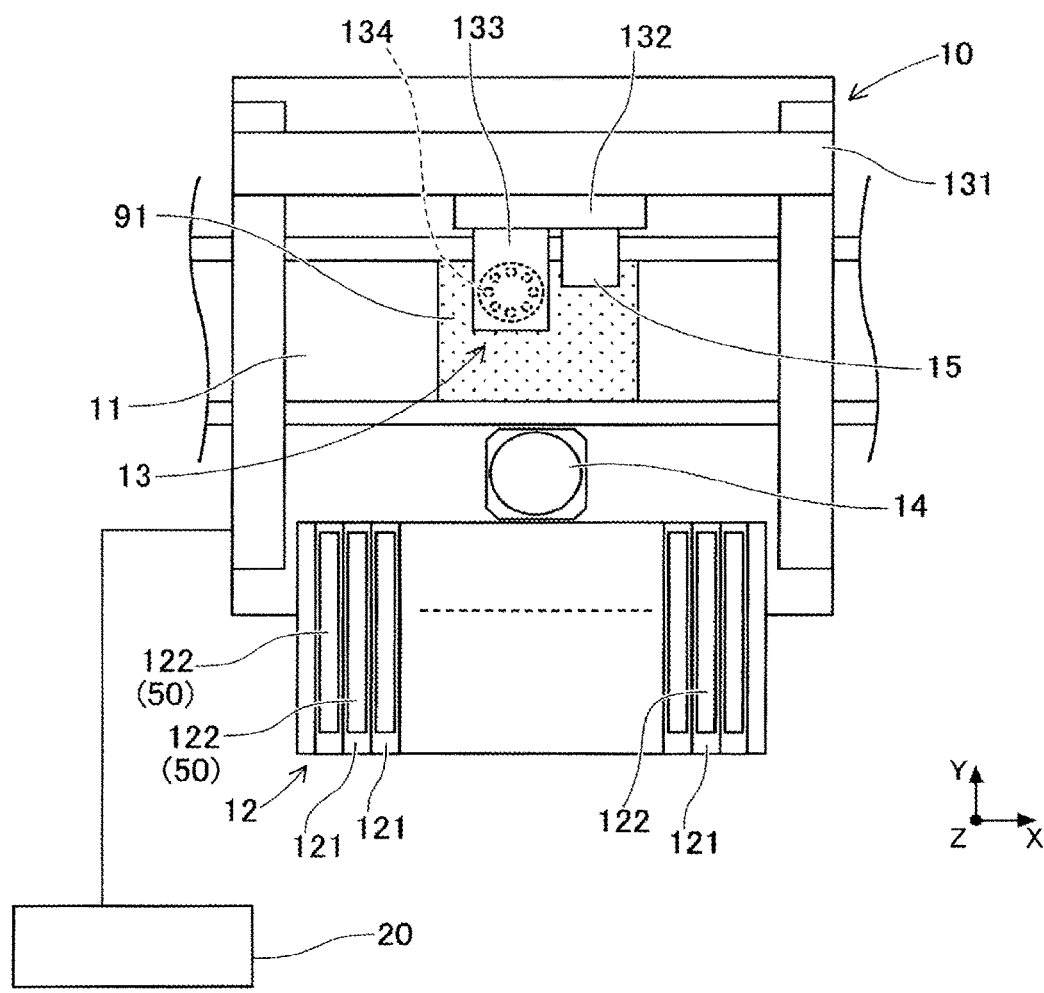
FIG. 1 is a schematic view showing a configuration of a component mounter.

As shown in FIG. 1, component mounter 10 includes board conveyance device 11. Board conveyance device 11 sequentially conveys board 91 in a conveyance direction, and positions board 91 in a predetermined position in the mounter.

1-2. Component Supply Device 12

Component mounter 10 includes component supply device 12. Component supply device 12 supplies components to be mounted on board 91. Component supply device 12 is such that feeders 122 are mounted individually in multiple slots 121. Feeder 122 adopts, for example, a tape feeder in which a carrier tape accommodating a large number of components is fed to be moved so as to supply the components to be picked up. In addition, feeder 122 adopts bulk feeder 50 which supplies components accommodated therein in a bulk state (in a loose state in which individual components are oriented irregularly) so that the components can be picked up. Bulk feeder 50 will be described in detail later.

1-3. Component Transfer Device 13

Component mounter 10 includes component transfer device 13. Component transfer device 13 transfers a component supplied by component supply device 12 onto a predetermined mounting position on board 91. Component transfer device 13 includes head driving device 131, moving body 132, mounting head 133, and suction nozzles 134. Head driving device 131 moves moving body 132 in horizontal directions (an X-direction and a Y-direction) by a linear motion mechanism. Mounting head 133 is detachably fixed to moving body 132 by a clamp member, not shown, and is provided to be movable in the horizontal directions within the mounter.

Mounting head 133 supports multiple suction nozzles 134 in such a manner as to be rotated, and raised and lowered. Suction nozzle 134 is a holding member configured to pick up and hold component 80 supplied by feeder 122. Suction nozzle 134 picks up a component supplied by feeder 122 using negatively pressurized air supplied thereto. As a holding member to be attached to mounting head 133, a chuck or the like can be adopted which holds a component by gripping the component.

1-4. Part Camera 14 and Board Camera 15

Component mounter 10 includes part camera 14 and board camera 15. Part camera 14 and board camera 15 are digital imaging devices having imaging elements such as CMOS. Part camera 14 and board camera 15 execute imaging based on control signals and send out image data acquired through the imaging. Part camera 14 is configured to image a component held by suction nozzle 134 from below. Board camera 15 is provided on moving body 132 in such a manner as to be movable in the horizontal directions together with mounting head 133. Board camera 15 is configured to image board 91 from above.

Figure 4:
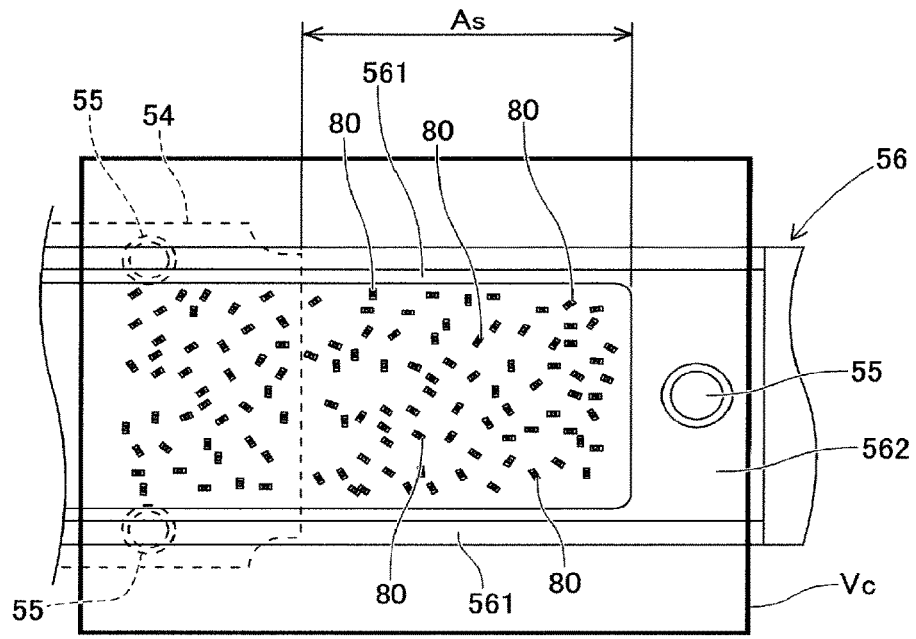
FIG. 4 is a diagram showing multiple components in a bulk state which are supplied by executing a component supply process.

In addition to imaging a front surface of board 91 as an imaging target, board camera 15 can image various types of devices as long as they are situated within a movable range of moving body 132 as imaging targets. For example, in the present embodiment, as shown in FIG. 4, board camera 15 can image supply area As, to which bulk feeder 50 supplies components 80, by capturing it in visual field Vc thereof. In this way, board camera 15 can additionally be used to image different imaging targets in order to acquire image data for use in various types of image processing.

1-5. Control Device 20

Figure 5:
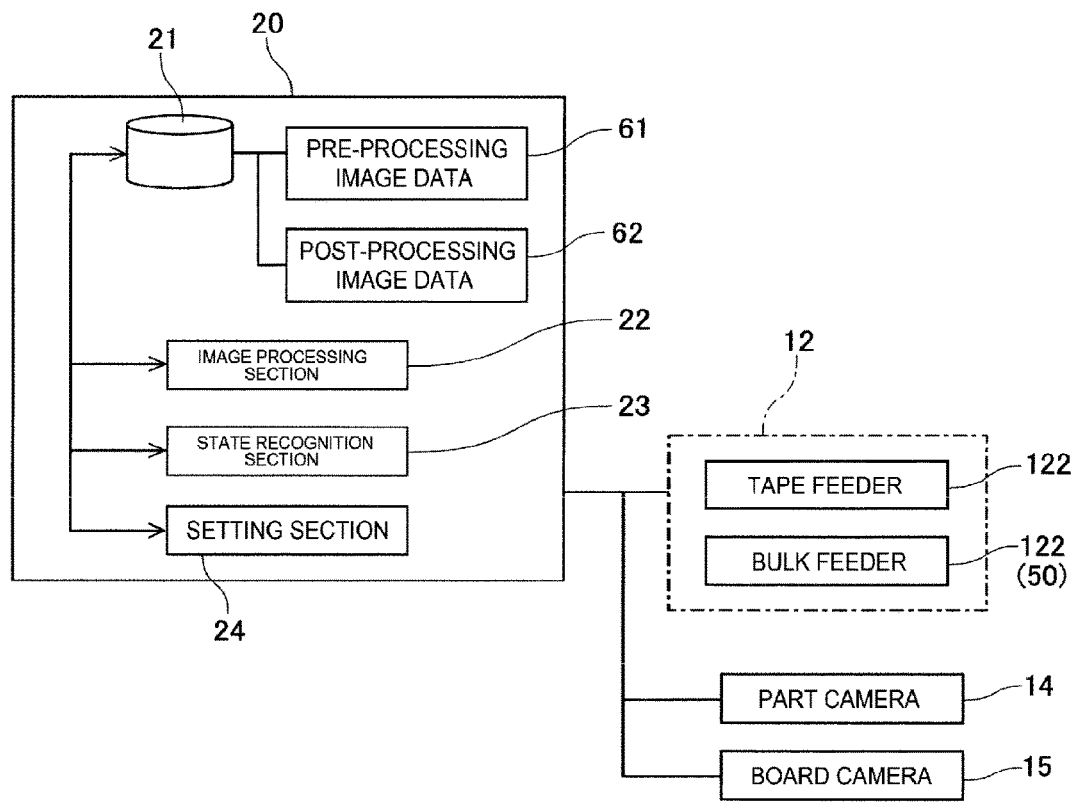
FIG. 5 is a block diagram showing a control device of the component mounter.

Component mounter 10 includes control device 20, as shown in FIG. 1. Control device 20 is mainly made up of CPU, various types of memories, and a control circuit. As shown in FIG. 5, control device 20 includes storage section 21. Storage section 21 is made up of an optical drive device such as a hard disk device, a flash memory, or the like. Storage section 21 of control device 20 stores various types of data such as a control program used for controlling a mounting process and the like. The control program denotes mounting positions, mounting angles, and a mounting order of components which are mounted on board 91 in the mounting process.

Control device 20 executes recognition processing for recognizing a held state of each of components which are held individually by the multiple holding members (suction nozzles 134). Specifically, control device 20 performs image processing on image data acquired through imaging by part camera 14 and recognizes a position and an angle of each component with respect to a reference position of mounting head 133. In addition to part camera 14, control device 20 may include, for example, a head camera unit which is provided integrally on mounting head 133 or the like so as to perform image processing on image data acquired as a result of the head camera unit imaging a component from a side, below or above.

Control device 20 controls mounting operations of components by mounting head 133 based on the control program to thereby execute the mounting process. Here, the mounting process includes a process of repeating a PP cycle (a pick-and-place cycle) including a pickup operation and a mounting operation multiple time. The "pickup operation" described above is an operation in which a component supplied by component supply device 12 is picked by suction nozzle 134.

In the present embodiment, in executing the pickup operation described above, control device 20 controls the operation of component supply device 12 including bulk feeder 50, and executes recognition processing for recognizing a supply state of component 80 by bulk feeder 50 in supply area As. The "recognition processing for recognizing a supply state" described above includes processing for recognizing whether there exists component 80 that can be picked up in supply area As, and, in the case that there exists such component 80, recognizing a position and an angle of that component 80. Then, control device 20 controls the operation of mounting head 133 in a pickup operation based on the result of the recognition processing of the supply state.

In addition, the "mounting operation" described above is an operation of mounting a picked up component at a predetermined mounting angle in a predetermined mounting position on board 91. In the mounting process, control device 20 controls the operation of mounting head 133 based on pieces of information which are output from various types of sensors, the results of the image processing, the control program, and the like. As a result, the positions and angles of multiple suction nozzles 134 supported by mounting head 133 are controlled. A detailed configuration of control device 20 will be described later.

2. Configuration of Bulk Feeder 50

Bulk feeder 50 is equipped on component mounter 10 and functions as at least a part of component supply device 12. Unlike the tape feeder, bulk feeder 50 does not use a carrier tape, and therefore has an advantage in that carrier tape loading, used-up tape collection, and the like can be omitted. On the other hand, since bulk feeder 50 supplies components 80 accommodated therein in a bulk state in which components 80 are not aligned as on a carrier tape, a supply state of component 80 may affect a pickup operation by the holding member such as suction nozzle 134.

Figure 6:
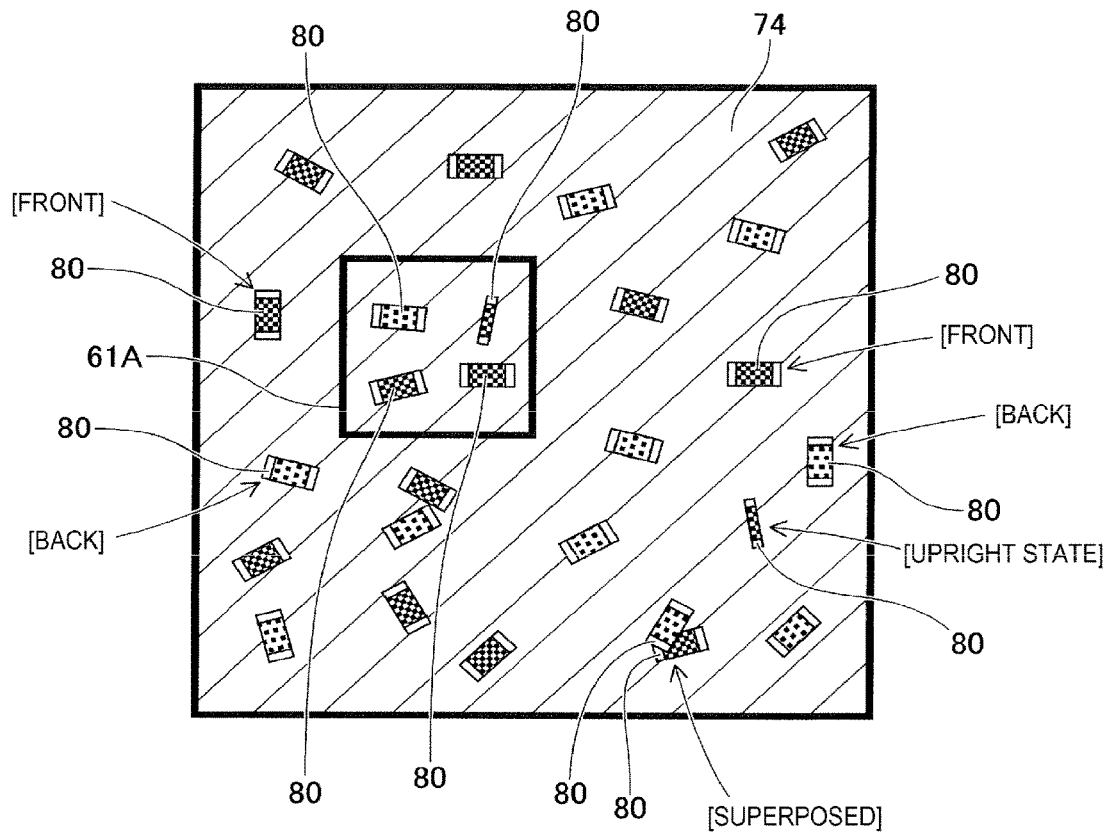
FIG. 6 is a diagram showing image data before processing which is used in recognition processing for recognizing supply states of components in a supply area.

Specifically, as shown in FIGS. 4 and 6, when components 80 are so close to be in touch with each other or are stacked on each other (a state in which components 80 are superposed on each other in an up-down direction), or component 80 is in an upright state in which a width direction constitutes an up-down direction thereof in supply area As, such components 80 cannot be a pickup target. In addition, since components 80 are supplied to supply area As while being oriented irregularly, component mounter 10 executes image processing for recognizing a supply state of component 80 (a pickup possibility of component 80 and an orientation of component 80 capable of being picked up). The supply state recognition processing will be described in detail later.

Figure 2:
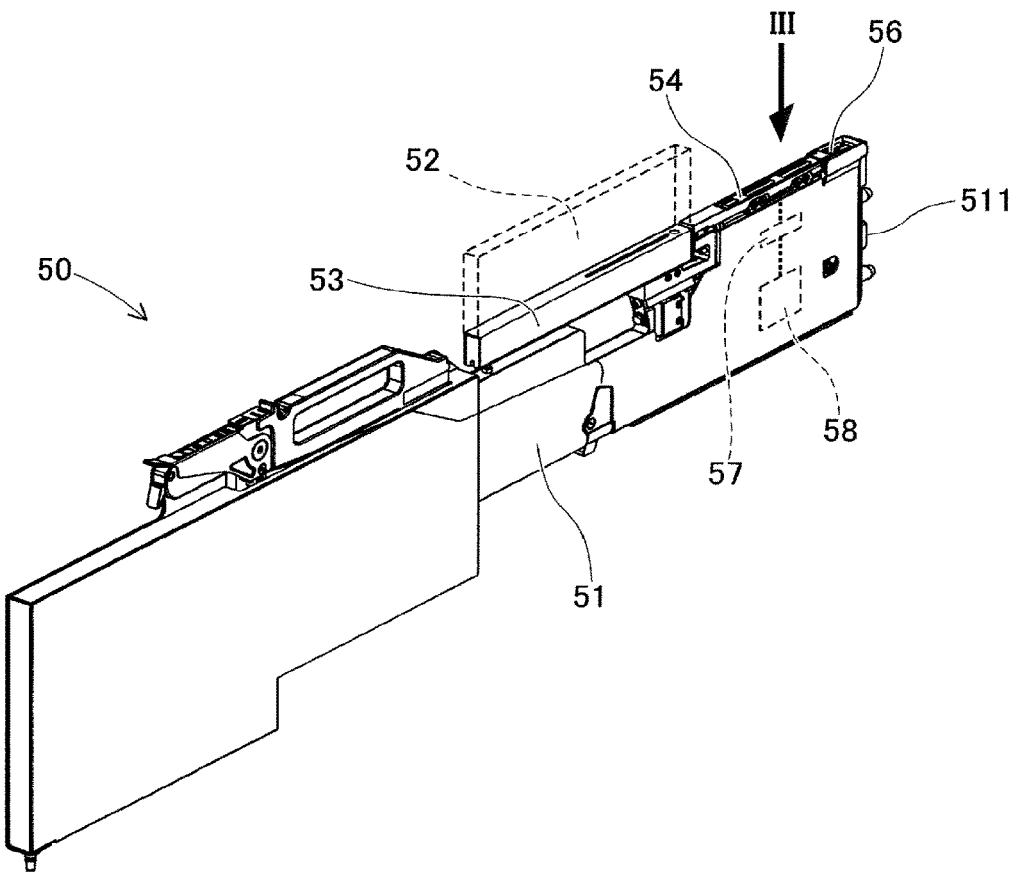
FIG. 2 is a perspective view showing an external appearance of a bulk feeder.

As shown in FIG. 2, bulk feeder 50 includes feeder main body 51 having a flat box shape. When set in slot 121 of component supply device 12, feeder main body 51 is fed electrically via connector 511 and can communicate with control device 20. A component case 52 for accommodating multiple components 80 in a bulk state is detachably attached to feeder main body 51.

Figure 3:
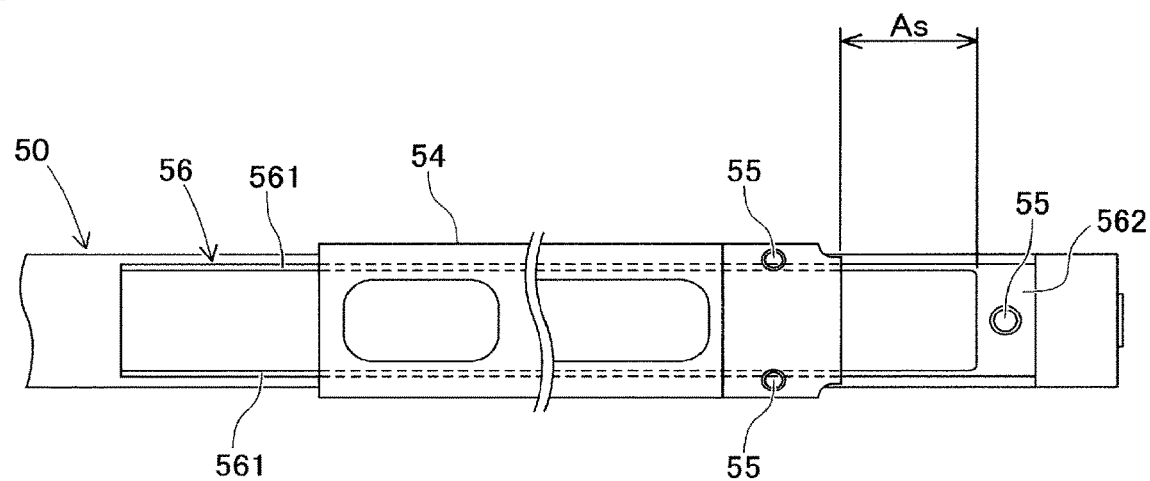
FIG. 3 is a plan view as seen from direction III in FIG. 2.

Bulk feeder 50 regulates the number or amounts of components 80 to be discharged from component case 52 using discharge device 53. As a result, multiple components 80 which are discharged from component case 52 are supplied to track member 56, which will be described later (refer to FIG. 3). Bulk feeder 50 includes cover 54 which is detachably attached to a front upper portion feeder body 51. Cover 54 prevents components 80 which are being conveyed on a conveyance path of track member 56, which will be described later, from scattering to the outside of bulk feeder 50. As shown in FIG. 3, pair of left and right circular reference marks 55, which indicate a reference position of bulk feeder 50, are affixed to an upper surface of cover 54.

Bulk feeder 50 includes track member 56, which is provided on the front upper portion of feeder main body 51. Track member 56 is formed in such a manner as to extend in a front-rear direction (a left-right direction in FIG. 3) of feeder main body 51. Pair of upwardly protruding side walls 561 are formed on both edges of track member 56 in a width direction (an up-down direction in FIG. 3) thereof. Pair of side walls 561 surround a circumferential edge of the conveyance path of track member 56 together with distal end portion 562 thereof so as to prevent the departure of components 80 which are being conveyed along the conveyance path. Circular reference mark 55, indicating a reference position of bulk feeder 50, is affixed to an upper surface of distal end portion 562.

Track member 56, which is configured as described above, has supply area As formed thereon. This "supply area As" is an area where components 80 are to be supplied in a bulk state. In other words, supply area As is an area where components 80 can be picked up by suction nozzles 134 supported on mounting head 133 and is contained in a movable range of mounting head 133. The "conveyance path" of track member 56 is a path along which components 80 pass from an area where components 80 are supplied from component case 52 to supply area As.

Bulk feeder 50 includes vibration device 57, which is provided in feeder main body 51. Vibration device 57 applies vibrations to track member 56 so as to vibrate track member 56 so that an external force directed toward the front or rear, and upwards is applied to components 80 on the conveyance path. Vibration device 57 applies a predetermined vibration to track member 56, so that multiple components 80 discharged from component case 52 onto track member 56 can be conveyed to supply area As via the conveyance path.

Bulk feeder 50 includes feeder control section 58 for executing a supply process of components 80 to supply area As. Feeder control section 58 controls the operation of vibration device 57 in response to a command from the outside, and supplies components 80 to supply area As by so conveying components 80 on the conveyance path. Feeder control section 58 may cause from time to time at least a part of components 80 in supply area As to retreat back to component case 52 therefrom, for example, in order to allow an appropriate amount of components 80 to remain in supply area As.

3. Detailed Configuration of Control Device 20

Figure 7:
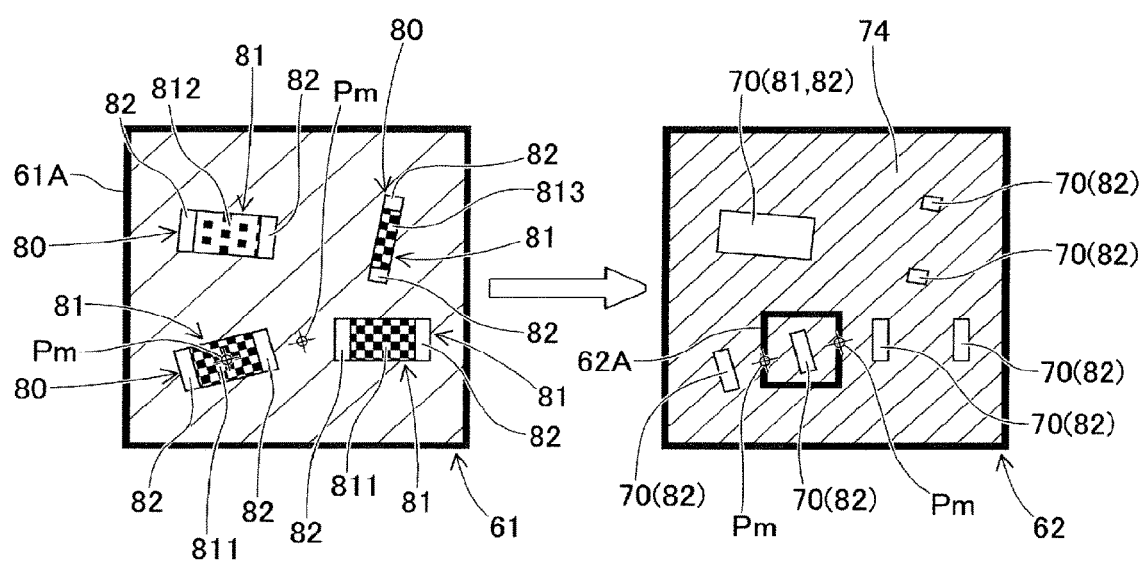
FIG. 7 illustrates enlarged views showing image data before and after processing in image processing.
Figure 8:
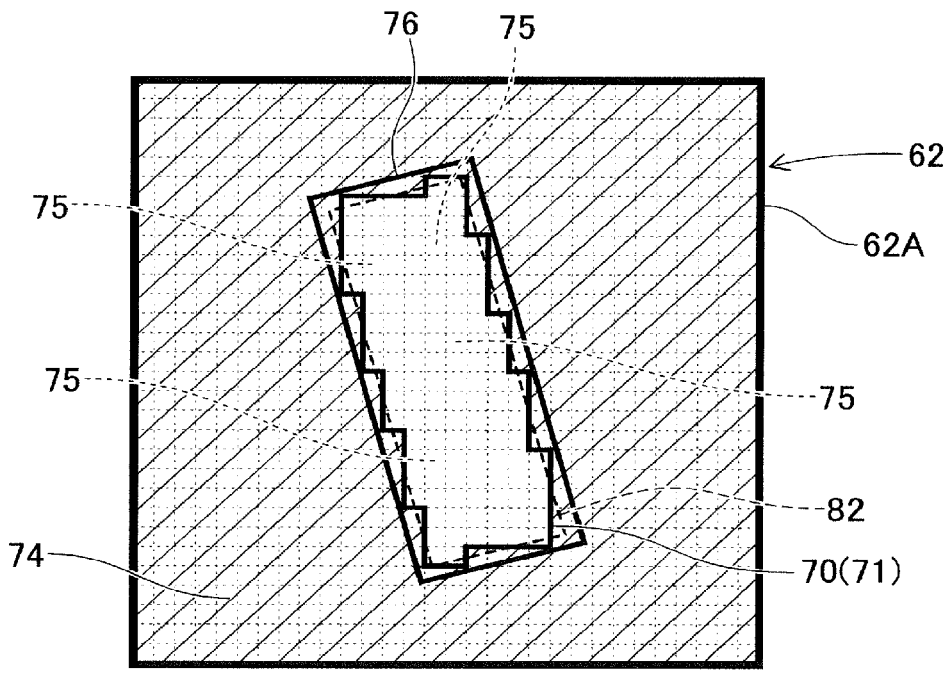
FIG. 8 is an enlarged view showing an extraction area in FIG. 7.

Referring to FIGS. 5 to 9, a detailed configuration of control device 20 of component mounter 10 will be described. In FIGS. 6 to 8, an area having a color of black or close to black is shown as hatched as a matter of convenience. Storage section 21 stores image data 61 acquired through imaging by board camera 15 (hereinafter, also referred to as "pre-processing image data 61"), and image data 62 on which image processing has been executed (hereinafter, also referred to as "post-processing image data 62").

In FIG. 7, extraction area 61A in pre-processing image data 61 is shown in an enlarged fashion on a left-hand side. In FIG. 7, extraction area 61A in post-processing image data 62 is shown in an enlarged fashion on a right-hand side. FIG. 8 shows extraction area 62A in post-processing image data 62 shown in FIG. 7 in a more enlarged fashion. Details of pre-processing image data 61 and post-processing image data 62 will be described later.

3-1. Image Processing Section 22

As shown in FIG. 5, control device 20 includes image processing section 22. Image processing section 22 executes predetermined image processing on pre-processing image data 61 (refer to FIG. 6) acquired by imaging supply area A as an imaging target by board camera 15. The "predetermined image processing" described above includes image processing for distinguishing areas of multiple feature portions on component 80 from areas other than the multiple feature portions in post-processing image data 62 based on brightness.

Here, the multiple "feature portions" on component 80 are portions indicating features which are formed spaced apart from each other on component 80. For example, in the case that component 80 has a rectangular chip shape, pair of terminals 82 provided individually at both ends of main body portion 81 can be regarded as multiple feature portions. In general, main body portion 81 is covered with, for example, a resin film having no conductivity. Pair of terminals 82 are formed of a conductive metal.

With this configuration, a visual difference is provided between main body portion 81 and pair of terminals 82. The brightness of main body portion 81 becomes lower than the brightness of terminals 82 in image data 61 acquired by imaging component 80 configured as described above. In the present embodiment, each of pair of terminals 82 constituting multiple feature portions on component 80 has the same shape and the same angle with respect to main body portion 81. In addition to pair of terminals 82 described above, three or more electrodes, marks, or the like formed in predetermined positions on component 80 can constitute feature portions of component 80.

When the image processing described above is executed, areas of multiple feature portions of component 80 are distinguished from areas other than the multiple feature portions (in the case that the feature portions are pair of terminals 82, main body portion 81 of component 80 and background 74) based on brightness in post-processing image data 62. Specifically, in the present embodiment, image processing section 22 executes binarization processing on pre-processing image data 61 using a threshold which is set to a value between the brightness of main body portion 81 and the brightness of pair of terminals 82 of component 80.

The image processing described above is not necessarily required to visually distinguish between the two areas but is intended to improve the recognition capability of state recognition section 23, which will be described later, of recognizing the two areas. Therefore, in the image processing, image processing section 22 may increase or decrease the brightness values of the two areas or may color the two areas depending on the positions or the like thereof. In addition, the binarization processing need not necessarily distinguish a white area from a black area but may process so that the brightnesses of the two areas are set to their average brightnesses or predetermined brightness values, for example.

In addition, in the binarization processing, the threshold can be set as required in accordance with various manners of recognition processing of a supply state by state recognition section 23. This is because, depending on types of components 80, in one type of component 80, a front need be distinguished from the back, and in another type of component 80, a certain adjustment need be executed due to similar brightnesses of component 80 and background 74 in pre-processing image data 61. For example, image processing section 22 may acquire a corresponding threshold from threshold information in which thresholds are set in advance for types of components 80 which are supplied by bulk feeder 50, and execute binarization processing as image processing.

More specifically, components 80 include a type of component 80 like a capacitor whose front and back surfaces do not have to be distinguished from each other in function. With this type of component 80, there will be no problem whether the front surface or the back surface is oriented upwards as long as the component is mounted in such a manner that a thickness direction constitutes an up-down direction and that pair of terminals 82 are positioned on lands of board 91. In contrast to this, components 80 include a type of component 80 like a resistor component whose front and back surfaces are required to be distinguished from each other in function. With this type of component 80, when the component is mounted on board 91, either the front surface or the back surface is required to be oriented upwards.

With the type of component 80 whose front and back surfaces are required to be distinguished from each other, there is a visual difference between front surface 811 and back surface 812 of main body portion 81. Specifically, the visual difference described above is caused by a color or characters or symbols written to indicate predetermined information, as a result of which the visual difference so caused is represented as a brightness difference in pre-processing image data 61. In the present embodiment, that a color closer to black than that of back surface 812 or a pattern is applied to front surface 811. The brightness of front surface 811 of main body portion 81 becomes lower than the brightness of back surface 812 of main body portion 81 in image data 61 acquired by imaging component 80 like the one described above.

The following description will be made on the assumption that there is a visual difference between front surface 811 and back surface face 812. In FIG. 7, visual differences among front surface 811, back surface 812, and side surface 813 are shown as different dotted patterns as a matter of convenience. It should be noted that side surface 813 of main body portion 81 is visually the same as or similar to front surface 811 or back surface 812 but has a different area from those of front surface 811 and back surface 812. As a result, in the case that component 80 stands in an upright state in such a manner that a width direction constitutes an up-down direction thereof, there may be a case in which the color of side surface 813 becomes the same as the color of front surface 811 in pre-processing image data 61, as shown in FIG. 7.

An upper surface of track member 56, which constitutes supply area As which functions as background 74 of image data 61, is colored in a color closer to black than a color of any portion of component 80. That is, in the case of component 80 whose front surface and back surface are required to be distinguished from each other, image processing section 22 executes the binarization processing using the threshold set to be between the brightness of front surface 811 and the brightness of back surface 812 so as to determine which of front surface 811 and back surface 812 of component 80 constitutes an upper surface thereof in post-processing image data 62. In the present embodiment, after having executed the image processing, image processing section 22 maintains an original state of pre-processing image data 61 and stores post-processing image data 62 in storage section 21 separately therefrom.

3-2. State Recognition Section 23

As shown in FIG. 5, control device 20 includes state recognition section 23. State recognition section 23 recognizes a supply state of component 80 in supply area As based on a feature amount of each of multiple feature portions in image data 62 resulting from execution of the image processing. The "feature amount of each feature portion" described above includes at least one of a shape and an angle of the relevant feature portion. Here, state recognition section 23 recognizes a position of each component 80 as a supply state of component 80 in supply area As.

Then, in the case that component 80 is of a type in which a front surface and a back surface need to be distinguished from each other, state recognition section 23 first recognizes multiple feature portions (pair of terminals 82) which are distinguished from areas other than the feature portions (main body portion 81 and background 74) by the image processing executed by image processing section 22. Here, in post-processing image data 62, component 80 in which multiple feature portions are not distinguished from main body portion 81 is such that main body portion 81 and pair of terminals 82 form a closed rectangular, as shown in FIG. 7. For this, state recognition section 23 recognizes that back surface 812 constitutes an upper surface of relevant component 80 and hence excludes it from recognition targets for position.

On the other hand, in the case that feature portions are distinguished from main body portion 81 and background 74, state recognition section 23 recognizes that front surface 811 constitutes the upper surface of relevant component 80 and further attempts to recognize a position thereof. With the image processing described above, however, since multiple feature portions belonging to identical component 80 are separated in post-processing image data 62, multiple feature portions belonging to identical component 80 are required to be determined appropriately from a large number of feature portions shown separated in post-processing image data 62. Then, state recognition section 23 adopts a configuration, which will be described below.

3-2-1. Reference Feature Portion 85

Here, one of multiple feature portions in image data 62 resulting from execution of the image processing is defined as a reference feature portion 85. Reference feature portion 85 is set arbitrarily or according to a preset rule. For example, a feature portion which is detected first, a feature portion lying near a predetermined position, or the like can be set as reference feature portion 85. State recognition section 23 recognizes whether a section having a brightness higher than the threshold constitutes a feature portion, and when it recognizes that the brighter section constitutes the feature portion, state recognition section 23 recognizes an orientation of the section recognized as the feature portion in pre-processing image data 61.

Let's assume that for example, the threshold for image processing is set to a value between the brightness of front surface 811 and the brightness of back surface 812 of main body portion 81 in pre-processing image data 61. That is, in image data 61, the brightness increases in the order of background 74, front surface 811 of main body portion 81, the threshold, back surface 812 of main body portion 81, and terminal 82. When image processing section 22 executes image processing (binarization processing) using the threshold set as described above, post-processing image data 62 is generated as shown in FIG. 7.

Specifically, in post-processing image data 62, back surface 812 and terminals 82 of main body portion 81 become white, while front surface 811 of main body portion 81 and background 74 become black. That is, in the case that front surface 811 of main body portion 81 constitutes the upper surface of component 80 which constitutes a feature portion, only terminals 82 of relevant component 80 become white. In addition, in the case that back surface 812 of main body portion 81 constitutes the upper surface of component 80, main body portion 81 and terminals 82 of relevant component 80 become white. In the case that side surface 813 constitutes the upper surface of component 80, although results may differ depending on types of components 80, in the present embodiment, let's assume that only terminals 82 become white as with the case in which front surface 811 of main body portion 81 constitutes the upper surface, as is shown in FIG. 7.

State recognition section 23 determines whether component area 70, which is colored white in image data 62 resulting from execution of the image processing, constitutes one of pair of terminals 82 of component 80 whose upper surface is made up of front surface 811 based on at least one of an area and shape of relevant component area 70. The "component area" described above is an area on the feature portion side of component 80 which is distinguished from background 74 based on brightness in post-processing image data 62 resulting from execution of the image processing.

When executing recognition processing of a supply state using the area of component area 70, state recognition section 23 first calculates an area of a portion of component area 70 which is occupied by one terminal 82. For this calculation, as shown in FIG. 8, state recognition section 23 may calculate an area of component area 70 based on the number of pixels 75 which make up component area 70 in post-processing image data 62. Specifically, state recognition section 23 counts the number of white pixels 75 which are collected together to thereby calculate an area of a portion of component area 70 through approximation based on the number of pixels 75 so counted.

State recognition section 23 compares the area calculated in the way described above with an area of terminal 82 (shown by dashed lines in FIG. 8) which is determined for each type of component 80 and determines whether relevant component area 70 is appropriate for the feature portion. Specifically, in the case that the area of component area 70 falls within a range of an allowable error, state recognition section 23 recognizes that component area 70 constitutes terminal 82. For example, in the case that the surface area of component area 70 is smaller or larger than the range of the allowable error, it is assumed that component 80 stands in an upright state, only a portion of lower terminal 82 of multiple superposed components 80 is imaged, or multiple terminals 82 staying adjacent to each other are imaged as a single terminal.

Further, state recognition section 23 recognizes a shape of terminal 82 which constitutes the feature portion. Specifically, state recognition section 23 first specifies a shape of component area 70 which is occupied by terminal 82. For this specification, as shown in FIG. 8, state recognition section 23 specifies a shape of component area 70 based on a shape of rectangular frame 76 having a minimum area which is circumscribed on component area 70 in post-processing image data 62. State recognition section 23 may set the shape itself of rectangular frame 76 as the shape of component area 70, or may set a shape resulting from offsetting inwards each side of rectangular frame 76 by a predetermined amount as the shape of component area 70.

State recognition section 23 compares the shape specified in the way described above with the shape of terminal 82 which is determined for each type of component 80 and recognizes that component area 70 represents terminal 82 in the case that the shapes are the same or similar to each other within a range of an allowable error. For example, in the case that the shape of component area 70 is dissimilar to the shape of terminal 82, it is assumed that the same cause exists as in the case in which the surface area of component area 70 is smaller or larger than the range of the allowable error as described above as when component 80 stands in an upright state.

State recognition section 23 recognizes a position and an angle of one of pair of terminals 82 based on the area of component area 70 calculated as described above and the shape of component area 70 specified as described above. In other words, state recognition section 23 determines whether the white area constitutes the feature portion (terminal 82) in post-processing image data 62, and in the case that it recognizes that the white area constitutes the feature portion, state recognition section 23 recognizes a position and an angle of the white area as a feature amount. One of multiple feature portions which are recognized as described above is recognized as reference feature portion 85.

3-2-2. Candidate Feature Portion 86

Figure 9:
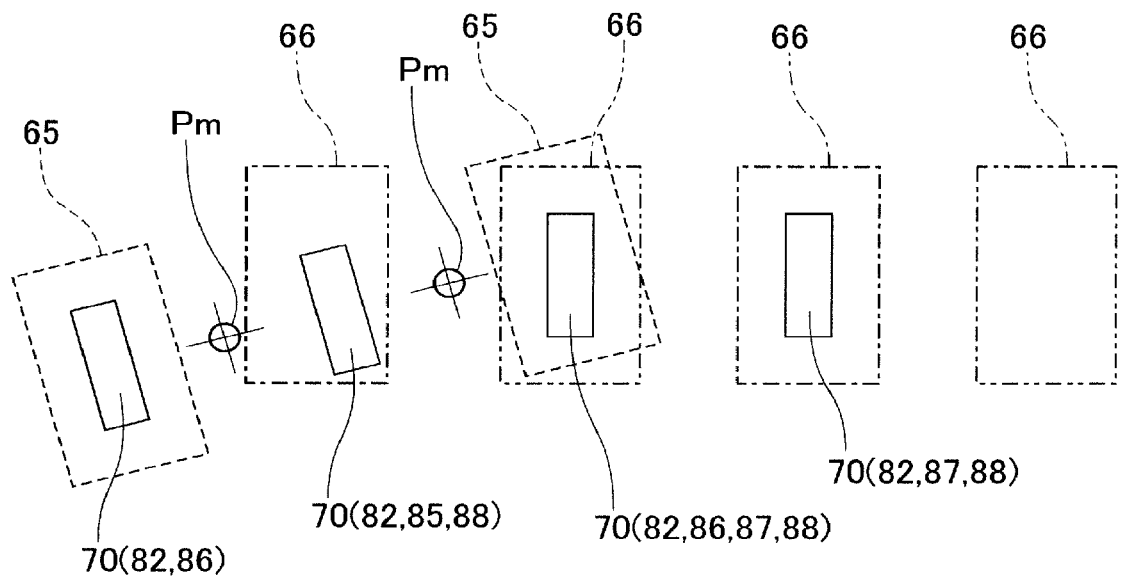
FIG. 9 is a diagram showing a search range based on a reference feature portion and multiple candidate feature portions.

Here, another feature portion which is included in predetermined search range 65, which is determined based on a position and a feature amount of reference feature portion 85, is defined as candidate feature portion 86 which can belong to identical component 80 together with reference feature portion 85. Predetermined search range 65 described above can be set as required in consideration of the type of component 80, the load of image processing, or the like. Specifically, predetermined search range 65 may be a rectangular range having a predetermined size which is centered at reference feature portion 85, or may be a rectangular range having a predetermined size which is centered at a position which is spaced a predetermined distance away from each side of reference feature portion 85 in a width direction as shown in FIG. 9.

A position and shape of search range 65 described above can be adjusted as required in accordance with a position and shape of the feature portion of component 80. Then, in post-processing image data 62, a feature portion positioned in predetermined search range 65 has a possibility that the feature portion belongs to identical component 80 together with reference feature portion 85, and is recognized as candidate feature portion 86 as described above. Then, state recognition section 23 determines whether relevant candidate section 86 belongs to identical component 80 together with reference feature portion 85 based on either of a feature amount or feature amounts of one or more candidate feature portions 86 which are included in search range 65 and a positional relationship between reference feature portion 85 and candidate feature portion 86.

State recognition section 23 executes component recognition processing for determining whether multiple feature portions make up identical component 80 and then executes component recognition processing for acquiring a position and an angle of each of multiple components 80 in post-processing image data 62. As a result, state recognition section 23 recognizes supply states of components 80 in supply area As. Details of the component recognition processing will be described later.

A supply state of component 80 in supply area As which is recognized by state recognition section 23 includes any one of a component orientation which denotes whether a thickness direction of component 80 is oriented in the up-down direction, a degree of separation which denotes whether multiple components 80 stay closer to each other or one another than a predetermined distance, and a pickup possibility which denotes whether component 80 can be picked up from supply area As. The component orientation in the supply state may include an orientation of component 80 which differs based on which surface of that component 80 is in contact with track member 56, as well as a position or an angle of that component 80 with respect to the reference position of bulk feeder 50.

The degree of separation in the supply state denotes an extent to which one component 80 stays separated from another component 80 and decreases further as the one component 80 stays closer to the other component 80. The degree of separation may be regarded as acceptable, for example, in the case that no other component 80 exists within a predetermined distance range from relevant one component 80, while it may be regarded as unacceptable in the case that even a part of another component 80 exists within the predetermined distance range of relevant one component 80. For example, in the case that two or more components 80 are superposed one on another or are in contact with one another in a horizontal direction, the degree of separation becomes lower than a reference value.

The pickup possibility in the supply state denotes whether individual components 80 supplied in supply area As are suitable for a pickup operation target object. The pickup possibility may be determined based on the component orientation or the degree of separation of components described above, or may be determined as required based on types of components 80, types of suction nozzles 134 to be used, precision required for a mounting process, or the like.

3-3. Setting Section 24

As shown in FIG. 5, control device 20 includes setting section 24. Setting section 24 sets component 80 for a pickup target from multiple components 80 supplied in supply area As based on the supply states recognized by state recognition section 23. More specifically, in the case that a pickup operation for picking up the same type of components 80 over multiple times in the PP cycle, setting section 24 sets only a required number of components 80 to be picked up from supply area As.

For this setting, setting section 24 sets components 80 for pickup targets from multiple components 80 supplied with an appropriate orientation (for example, an orientation in which front surface 811 constitutes the upper surface) in supply area As and a pickup order so as to shorten an overall required time for the pickup operation to be executed over multiple times. Setting section 24 sets components 80 for pickup target and a pickup order so as to shorten, for example, a movement path of mounting head 133 which is made up in association with a pickup operation to be performed by relevant mounting head 133.

3-4. Control of Pickup Operation by Control Device 20

In the PP cycle, control device 20 moves mounting head 133, and raises and lowers suction nozzles 134 in accordance with the set pickup order of components 80 set as pickup targets, causing suction nozzles 134 to pick up components 80 set as pickup targets. In addition, in the case that the number of components 80 in components 80 supplied in supply area As which can be set as pickup targets is reduced to a predetermined number (for example, a required number for a subsequent PP cycle) or smaller, control device 20 sends out to the bulk feeder a control command of execution of the component supply process of supplying components 80.

4. Mounting Process by Component Mounter 10

A mounting process carried out by component mounter 10 will be described by reference to FIGS. 9 to 12. After bulk feeder 50 is set in slot 121, control device 20 executes calibration processing to thereby recognize the position of supply area As in the component mounter. Specifically, control device 20 first causes board camera 15 to move above three reference marks 55 of bulk feeder 50, and acquires image data by imaging those three reference marks 55 using board camera 15. Then, control device 20 recognizes the position of bulk feeder 50 in the component mounter, that is, the position of supply area As, based on the positions of three reference marks 55 included in the image data as a result of image processing and the position of board camera 15 when those three reference marks 55 are imaged thereby.

In a mounting process, control device 20 causes bulk feeder 50 to execute a component supply process for supplying multiple components 80 to supply area As in a bulk state. Bulk feeder 50 inputs the control command from control device 20 and executes the component supply process at an appropriate timing, for example, when board 91 is conveyed by board conveyance device 11, when mounting operations are executed in the PP cycle, and the like.

4-1. Details of Image Processing and Recognition Processing of Supply State

Figure 10:
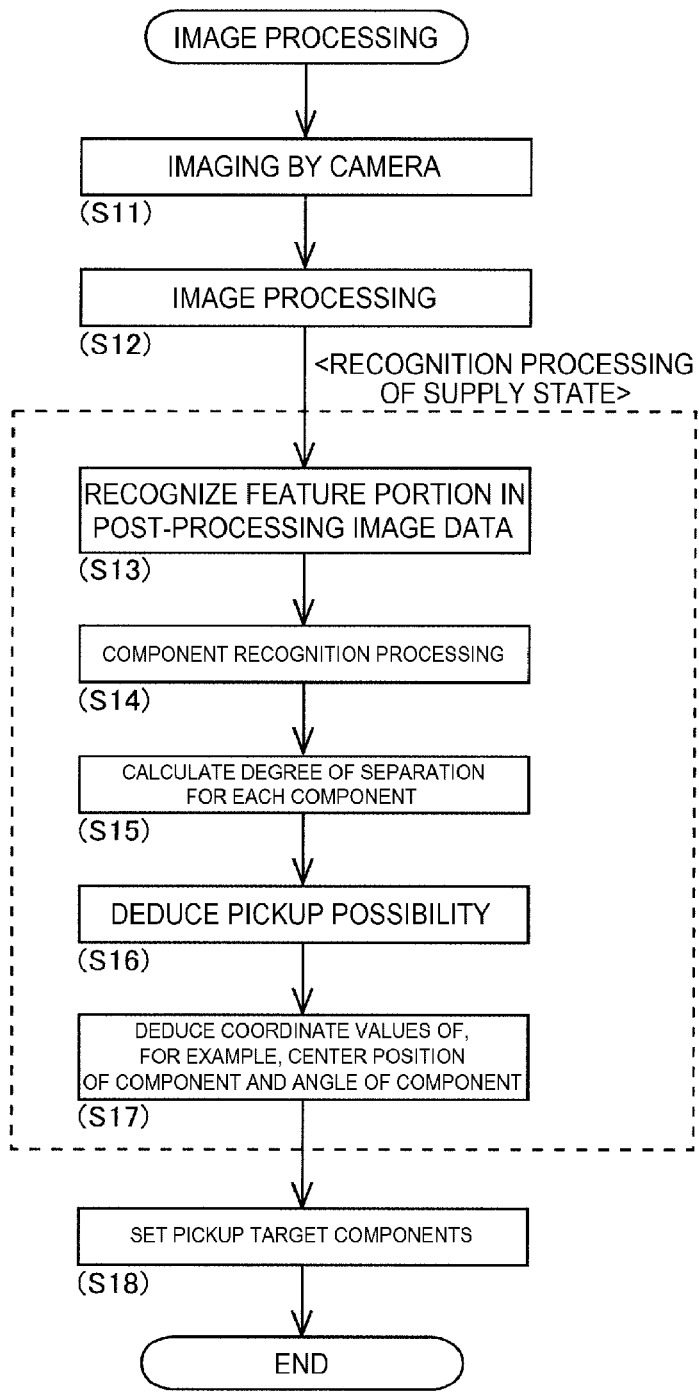
FIG. 10 is a flowchart showing image processing carried out by the component mounter.

After bulk feeder 50 has executed the component supply process, control device 20 executes image processing as shown in FIG. 10. Control device 20 first causes board camera 15 to execute imaging (S11). Specifically, control device 20 causes board camera 15 to move above supply area As of bulk feeder 50 and causes board camera 15 to image supply area As to thereby acquire image data 61. In addition, control device 20 sets image processing that is applied to image data 61 in accordance with a type of components 80 supplied by bulk feeder 50. Image processing may be set in advance by an operator and be designated by data such as a control program.

Next, image processing section 22 executes an image processing process (S12). Specifically, image processing section 22 executes binarization processing on pre-processing image data 61 by use of a predetermined threshold, and generates post-processing image data 62. Subsequently, state recognition section 23 executes supply state recognition processing (S13 to S17). Specifically, state recognition section 23 first recognizes feature portions of component 80 in post-processing image data 62 (S13). In the present embodiment, state recognition section 23 acquires a feature amount of each of multiple feature portions in post-processing image data 62.

State recognition section 23 executes component recognition processing for recognizing individual components 80 based on a large number of feature portions in post-processing image data 62 (S14). In the component recognition processing, state recognition section 23 repeatedly executes the recognition processing described above, for example, until a required number of components 80 are recognized in a subsequent PP cycle. As a result, state recognition section 23 recognizes at least a part of multiple components 80 in post-processing image data 62. Details of the component recognition processing will be described later.

In the component recognition processing (S14), the manner is described in which the front and back surfaces of component 80 are required to be distinguished from each other; however, in the case that component 80 is of a type in which front and back surfaces of component 80 do not have to be distinguished from each other in function as with the case of a capacitor, post-processing image data 62 can be generated in such a manner that multiple feature portions belonging to identical component 80 are not separated in the previous image processing process (S12). In such a case, in the component recognition processing (S14), the determination on whether the separated feature portions belong to identical component 80 is omitted, and the separated feature portions are simply recognized for each of multiple components 80.

State recognition section 23 calculates a degree of separation of each of components 80 (S15). As a result, an extent to which some components 80 are separated from other components 80 in supply area As is calculated. Subsequently, state recognition section 23 deduces a pickup possibility for each component 80 (S16). Specifically, state recognition section 23 determines whether each component 80 is suitable for a pickup operation target based, for example, on component orientation and degree of separation. Finally, for component 80 that can be picked up as a pickup target, state recognition section 23 deduces coordinate values of a center position and a reference position of that component 80 and an angle of that component 80 (S17).

To be specific, in the case that multiple feature portions are separated from each other, state recognition section 23 calculates a position and an angle of recognized component 80 based on positions or angles of multiple feature portions of that component 80. Specifically speaking, in the case that feature portions of component 80 are pair of terminals 82, state recognition section 23 defines an intermediate position between the terminals as a reference position of component 80 to thereby deduces angles of relevant terminals 82 as an angle of that component 80. The "reference position" of component 80 described above is a position that is set arbitrarily on an upper surface of relevant component 80, and when suction nozzle 134 is used in a pickup operation, the reference position is set at a suitable position for pickup by suction nozzle 134 such as a center, a center of gravity, or a flat area of that component 80.

Setting section 24 sets components 80 for pickup targets from multiple components 80 which are supplied in supply area As in an appropriate orientation and a pick up order based on the supply state recognized by state recognition section 23 (S18). In a PP cycle, control device 20 repeatedly executes a pickup operation for picking up components 80 using multiple suction nozzles 134 based on the results of the image processing. For this pickup operation, control device 20 causes mounting head 133 to be positioned sequentially in accordance with the positions of those components 80 set as pickup targets while following the pickup order set by setting section 24.

Control device 20 repeatedly executes the PP cycle based on the control program until components 80 are completely mounted in all mounting positions as required. Control device 20 sends out to the bulk feeder a control command of execution of the component supply process of supplying components 80 at an appropriate timing. Then, control device 20 executes the image processing again after multiple components 80 are supplied to supply area As.

Figure 11:
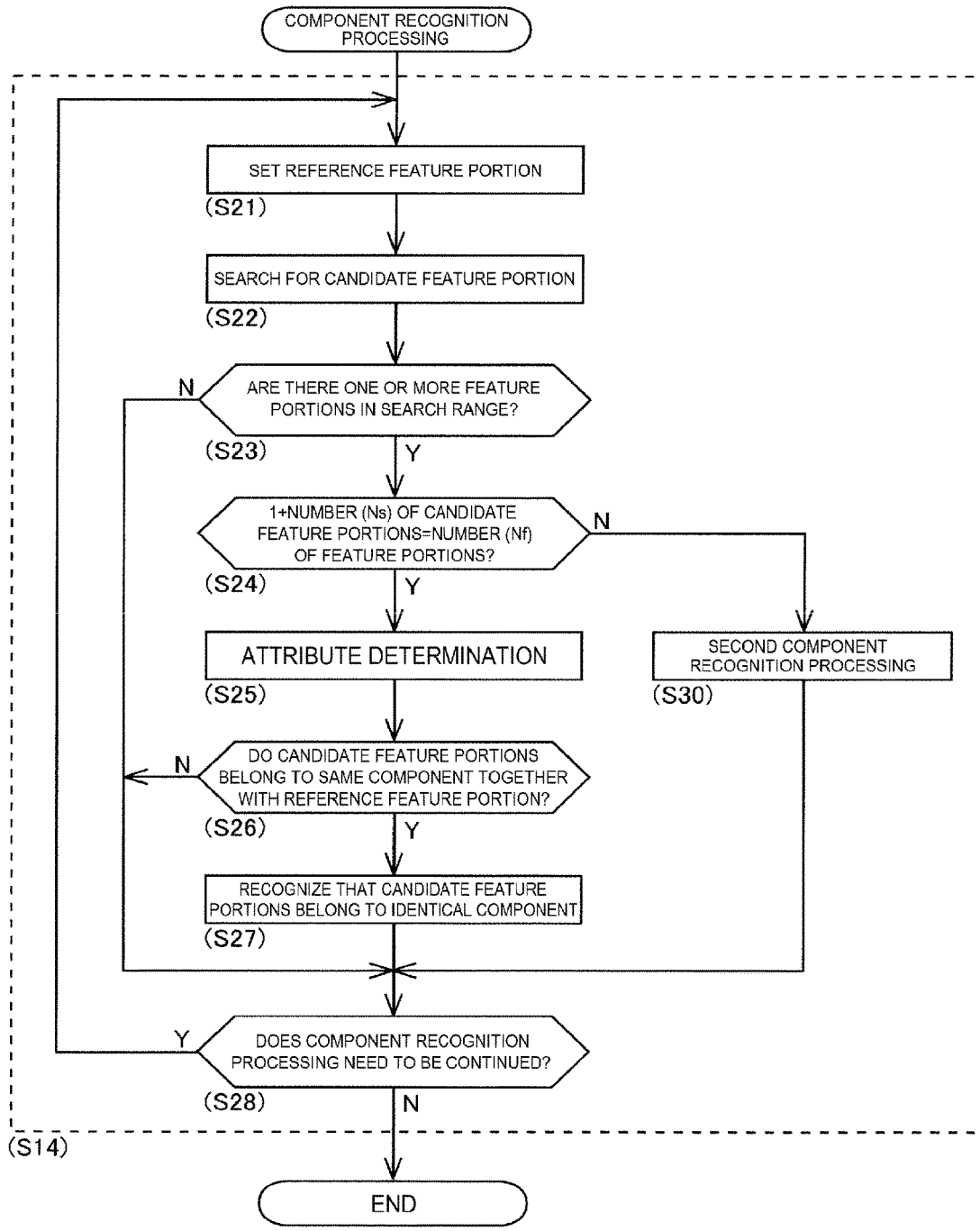
FIG. 11 is a flowchart showing component recognition processing in supply state recognition processing.

4-2. Component Recognition Processing in Supply State Recognition Processing In the component recognition processing (S14), state recognition section 23 sets reference feature portion 85 as shown in FIG. 11 (S21). State recognition section 23 sets one of multiple feature portions in post-processing image data 62 excluding feature portions recognized as belonging to identical component 80 to reference feature portion 85 arbitrarily or according to a predetermined rule (refer to FIG. 9).

Next, state recognition section 23 searches for candidate feature portion 86 which is included in predetermined search range 65 which is defined based on reference feature portion 85 (S22). Here, as shown in FIG. 9, search range 65 is set to a range in which there is a high possibility of existence of second terminal 82 when first terminal 82 is defined as reference feature portion 85. If there are one or more feature portions in search range 65 described above (S23: Yes), state recognition section 23 compares the number of feature portions (1+Ns) resulting from combining reference feature portion 85 and candidate feature portion 86 included in search range 65 with the number of feature portions (Nf) formed in one component 80 (S24).

Here, in the present embodiment, the "number of feature portions (Nf)" formed in one component 80 is two (Nf=2) since pair of terminals 82 constitute the feature portions of component 80. If the number of candidate feature portions 86 detected in search range 65 is one (Ns=1), the number of feature portions (1+Ns=2) obtained by combining reference feature portion 85 and candidate feature portion 86 is equal to the number of feature portions (Nf=1) formed in one component 80 (S24: Yes).

In this case, state recognition section 23 determines whether one or more candidate feature portions 86 included in search range 65 belong to identical component 80 together with reference feature portion 85 (S25). Specifically, state recognition section 23 executes the attribute determination (S25) described above based on either of the feature amount of candidate feature portion 86 and the positional relationship between reference feature portion 85 and candidate feature portion 86. This attribute determination can adopt various manners as will be described below.

4-2-1. First Manner of Attribute Determination

In the case that a degree of matching of the shape of reference feature portion 85 with the shape of candidate feature portion 86 is equal to or larger than a preset threshold, state recognition section 23 may determine that relevant candidate feature portion 86 belongs to identical component 80 together with relevant reference feature portion 85. On the assumption that each of the feature portions has the same shape (in the present embodiment, pair of terminals 82), state recognition section 23 compares the shape included in the feature amount of reference feature portion 85 with the shape included in the feature amount of candidate feature portion 86.

If the degree of matching of the shapes so compared with is equal to or larger than the threshold, state recognition section 23 determines that relevant candidate feature portion 86 belongs to identical component 80 together with relevant reference feature portion 85. With this configuration, even though design information including the shapes of the feature portions is not acquired in advance, the attribute determination can be executed through comparison with the shape of reference feature portion 85.

4-2-2. Second Manner of Attribute Determination

In the case that a degree of matching of the shape of candidate feature portion 86 with an ideal shape of candidate feature portion 86 is equal to or larger than a preset threshold, state recognition section 23 may determine that relevant feature portion 86 belongs to identical component 80 together with reference feature portion 85. State recognition section 23 acquires in advance the ideal shape of the feature portion of component 80 based, for example, on design information and compares the ideal shape with the shape included in the feature amount of candidate feature portion 86.

If the degree of matching of the shapes so compared with is equal to or larger than the threshold, state recognition section 23 determines that relevant candidate feature portion 86 belongs to identical component 80 together with relevant reference feature portion 85. With this configuration, even though the shape of candidate feature portion 86 differs from the shape of reference feature portion 85, the attribute determination can be performed for each candidate feature portion 86.

4-2-3. Third Manner of Attribute Determination

In the case that a degree of matching of the angle of reference feature portion 85 with the angle of candidate feature portion 86 is equal to or larger than a preset threshold, state recognition section 23 may determine that relevant feature portion 86 belongs to identical component 80 together with reference feature portion 85. On the assumption that the feature portions each have the same angle (in the present embodiment, pair of terminals 82 formed in such a manner that longitudinal directions are parallel), state recognition section 23 compares the angle included in the feature amount of reference feature portion 85 with the angle included in the feature amount of candidate feature portion 86.

If the degree of matching of the shapes so compared with is equal to or larger than the threshold, state recognition section 23 determines that relevant candidate feature portion 86 belongs to identical component 80 together with relevant reference feature portion 85. With this configuration, even though state recognition section 23 does not acquire design information including the angles of the individual feature portions, state recognition section 23 can perform the attribute determination by comparison with the angle of reference feature portion 85.

4-2-4. Fourth Manner of Attribute Determination

In the case that a degree of matching of the angle of candidate feature portion 86 with an ideal angle of candidate feature portion 86 is equal to or larger than a preset threshold, state recognition section 23 may determine that relevant candidate feature portion 86 belongs to identical component 80 together with reference feature portion 85. State recognition section 23 acquires in advance the ideal angle of the feature portion of component 80 based, for example, on angle information and compares the ideal angle with the angle included in the feature amount of candidate feature portion 86.

If the degree of matching of the shapes so compared with is equal to or larger than the threshold, state recognition section 23 determines that relevant candidate feature portion 86 belongs to identical component 80 together with relevant reference feature portion 85. With this configuration, even though the angle of candidate feature portion 86 differs from the angle of reference feature portion 85, state recognition section 23 can perform the attribute determination for each candidate feature portion 86.

4-2-5. Fifth Manner of Attribute Determination

In executing the attribute determination, state recognition section 23 can adopt a manner using pre-processing image data 61. Specifically, state recognition section 23 first deduces a position or positions of one or more measurement points Pm which are each located in an area between reference feature portion 85 and candidate feature portion 86 in image data 62 on which the image processing has been executed (refer to FIG. 7). Subsequently, state recognition section 23 measures a brightness of a position corresponding to the measurement point Pm in original image data 61 on which the image processing has not yet been executed.

Then, state recognition section 23 determines whether an area lying between reference feature portion 85 and candidate feature portion 86 is a part of component 80 or background 74 based on the brightness so measured. That is, state recognition section 23 determines whether main body portion 81 exists between reference feature portion 85 and candidate feature portion 86 by making use of the fact that there is a difference between the brightness of main body portion 81 of component 80 and the brightness of background 74 in image data 61 on which the image processing such as the binarization processing has not yet been executed.

State recognition section 23 determines whether candidate feature portion 86 belongs to identical component 80 together with reference feature portion 85 based on the results of the determination. That is, in the case that the determination result is obtained which determines that main body portion 81 exists between reference feature portion 85 and candidate feature portion 86, state recognition section 23 determines that candidate feature portion 86 belongs to identical component 80 together with reference feature portion 85.

On the other hand, in the case that the determination result is obtained which determines that main body portion 81 does not exist between reference feature portion 85 and candidate feature portion 86 but background 74 exists therebetween, state recognition section 23 determines that candidate feature portion 86 does not belong to identical component 80 together with reference feature portion 85. With this configuration, the determination precision of the attribute determination can be improved. Measurement point Pm described above only need be set at a part where main body portion 81 is considered to exist based on the positional relationship between reference feature portion 85 and candidate feature portion 86. In particular, measurement point Pm is preferably set in a position on main body portion 81 where a difference in brightness between main body portion 81 and background 74 becomes remarkable.

Measurement point Pm may be set in a center position of component 80 or may be set in a position which lies by a predetermined distance away from the center position in a predetermined direction. Multiple measurement points Pm may be set from the viewpoint of improving the determination precision. However, in the case that the difference in brightness between main body portion 81 and background 74 is clear in pre-processing image data 61, even one measurement point Pm is good enough. The position and number of measurement points Pm are set for each type of component 80.

4-2-6. Attribute Determination

In executing the attribute determination, state recognition section 23 may adopt the first to fifth manners of attribute determination by combining these manners appropriately based on the precision required for the mounting process or the production efficiency, or may switch between the first to fifth manners in adopting them based on types of components 80 or the equipment configuration of component mounter 10. In addition, in executing an attribute determination based on either of the feature amount of candidate feature portion 86 and the positional relationship between reference feature portion 85 and candidate feature portion 86, state recognition section 23 can adopt a manner which differs from the first to fifth manners.

In the attribute determination (S25) described above, if state recognition section 23 obtains the determination result that candidate feature portion 86 belongs to identical component 80 together with reference feature portion 85 (S26: Yes), state recognition section 23 determines that these feature portions belong to identical component 80 (S27). Thereafter, or in the attribute determination (S25), if it obtains the determination result that candidate feature portion 86 does not belong to identical component 80 together with reference feature portion 85 (S26: No), state recognition section 23 determines whether the component recognition processing needs to be continued (S28).

Specifically, for example, if the number of recognized components 80 in post-processing image data 62 reaches a predetermined number, or if the attribute determination has been executed on all the feature portions in post-processing image data 62, state recognition section 23 determines that the continuation of the component recognition processing is unnecessary (No in step S28), and ends the component recognition processing.

The "predetermined number" described above can be set to, for example, a number of components 80 necessary for a subsequent PP cycle or a number resulting from adding a margin to the number of necessary components 80. On the other hand, for example, if there remain feature portions which have not yet been recognized as components 80 in post-processing image data 62, state recognition section 23 determines that the continuation of the component recognition processing is necessary (S28: Yes), and repetitively executes the operations in S21 to S27.

In the present embodiment, if the number (1+Ns) resulting from adding reference feature portion 85 to the number of the candidate feature portions 86 detected in search range 65 is equal to the number (Nf) of the feature portions formed on one component 80 (1+Ns=Nf, S24: Yes), state recognition section 23 is described as executing the attribute determination (S25). In contrast to this, in the case described above (S24: Yes), state recognition section 23 may omit the attribute determination (S25) and determine that candidate feature portion 86 belongs to identical component 80 together with reference feature portion 85 (S27).

4-3. Second Component Recognition Processing

Figure 12:
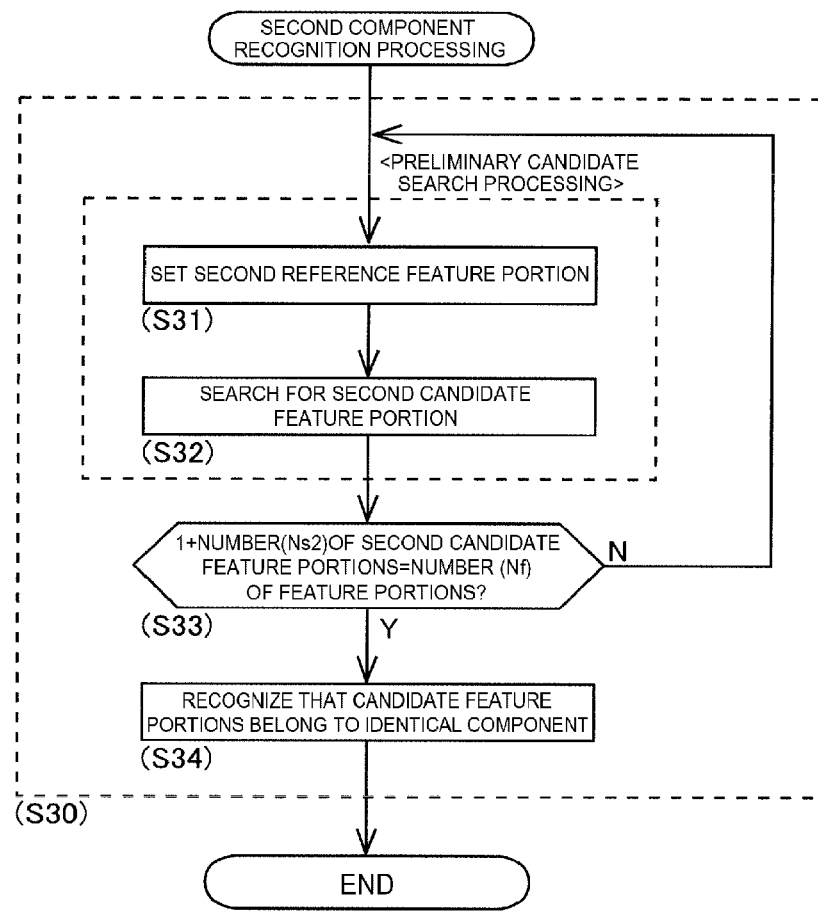
FIG. 12 is a flowchart showing second component recognition processing in the component recognition processing.

In the component recognition processing (S14) described above, there may be a case in which the number of feature portions (1+Ns) obtained by combining reference feature portion 85 and candidate feature portions 86 detected in search range 65 exceeds the number of feature portions (Nf) formed on one component 80 (1+Ns>Nf, S24: No). In this case, state recognition section 23 may execute second component recognition processing (S30), as shown in FIG. 12.

Specifically, state recognition section 23 first executes preliminary candidate search processing (S31, S32). Here, as shown in FIG. 9, one of multiple candidate feature portions 86 included in search range 65 is defined as second reference feature portion 87. In addition, other feature portions included in predetermined second search range 66, which is determined based on a position and a feature amount of second reference feature portion 87, are defined as second candidate feature portions 88 which can belong to identical component 80 together with second reference feature portion 87.

In the preliminary candidate search processing, state recognition section 23 first sets second reference feature portion 87 (S31). Next, state recognition section 23 searches for second candidate feature portions 88 included in second search range 66 (S32). Since this preliminary candidate searching processing (S31, S32) is substantially the same as S21 and S22 in the component recognition processing, a detailed description thereof will be omitted here. Reference feature portion 85 set in S21 can be detected as second candidate feature portion 88.

Subsequently, if the number of feature portions (1+Ns2) resulting from combining second reference feature portion 87 and second candidate feature portions 88 included in second search range 66 is not equal to the number (Nf) of feature portions formed on one component 80 (S33: No), state recognition section 23 executes the preliminary candidate search processing (S31, S32) again. In this way, state recognition section 23 repeatedly executes the preliminary candidate search processing (S31, S32) as required. FIG. 9 shows a state in which the preliminary candidate search processing (S31, S32) is executed twice.

If the number of feature portions (1+Ns2) resulting from combining second reference feature portion 87 and second candidate feature portions 88 becomes the number of feature portions (Nf) on component 80 (S33: Yes), state recognition section 23 determines that second candidate feature portion or sections 88 detected by the preliminary candidate search processing (S31, S32) executed last belong to identical component 80 together with second reference feature portion 87 (S34). In addition, after the second component recognition processing (S30) has been ended, state recognition section 23 resumes the initial component recognition processing from S28.

For this initial component recognition processing, in search processing (S22) for candidate feature portion 86 based on initial reference feature portion 85, candidate feature portions 86 which have already been recognized as belonging to component 80 are excluded from detection targets. Then, for candidate feature portions 86 which have not yet been determined to belong to component 80, state recognition section 23 determines whether those candidate feature portions 86 belong to identical component 80 together with reference feature portion 85 (S25).

5. Advantageous Effects Provided by Configuration of Embodiment

With the configuration of the embodiment that has been described heretofore, since the search for candidate feature portions 86 is executed over the search target, which is predetermined search range 65 which is determined based on the position and the feature amount of reference feature portion 85, the efficiency of the search processing (S22) can be improved. Further, since the determination on whether candidate feature portion 86 belongs to identical component 80 together with reference feature portion 85 is executed on multiple candidate feature portions 86 based on the feature amounts thereof or the positional relationship with reference feature portion 85, an erroneous recognition of identical component 80 based on feature portions of different component 80 can be prevented. As a result, the precision of the recognition processing of a supply state of component 80 in supply area as can be improved.

6. Modified Manners of Embodiment

6-1. Attribute Determination

In the recognition processing of a supply state, state recognition section 23 can appropriately adopt a variety of manners such as the first to fifth manners of attribute determination and may adopt the first to fifth manners of attribute determination while switching between them depending on types of components 80 or shapes, brightness, positions, and types of feature portions. The feature portions may be defined by only a shape or only an angle of a part making up component 80. Depending on a type of component 80, there may be a case in which component 80 has three or more feature portions or has feature portions having different shapes.

In the recognition processing of a supply state, state recognition section 23 may execute the attribution determination only for multiple feature portions or only for the positional relationship based on the degree of matching of the individual feature portions or the degree of matching with the ideal shape or the ideal position. State recognition section 23 can appropriately switch between the manners of attribute determination in accordance with the required time or the required recognition precision which is allowed for execution of the recognition processing of a supply state.

6-2. Component Recognition Processing

In the embodiment, state recognition section 23 adopts the manner in which the preliminary candidate search processing (S31, S32) is executed as described above. In contrast to this, state recognition section 23 can adopt other manners. For example, in the component recognition processing (S14), if the number of feature portions (1+Ns) resulting from combining reference feature portion 85 and candidate feature portions 86 included in search range 65 exceeds the number of feature portions (Nf) formed on one component 80 (S24: Yes), state recognition section 23 may determine that multiple candidate feature portions 86 whose feature amounts are closer to ideal amounts belong to identical component 80 together with reference feature portion 85.

6-3. Cameras

In the embodiment, board camera 15 is described as the camera for imaging supply area As of bulk feeder 50. In contrast to this, component mounter 10 may include a camera provided above bulk feeder 50 and configured to image supply area As. The camera may be dedicated to imaging of supply area As or may also be used for other purposes. With this configuration, the camera is fixed in place, thereby making it possible to improve the precision of the calibration processing. However, the manner described in the embodiment is preferable from the viewpoint of reducing the facility cost.

REFERENCE SIGNS LIST

10: component mounter, 12: component supply device, 15: board camera, 20: control device, 21: storage section, 22: image processing section, 23: state recognition section, 24: setting section, 50: bulk feeder, 61: (pre-processing) image data, 62: (post-processing) image data, 65: search range, 66:

second search range, 70: component area, 74: background, 75: pixel, 76: rectangular frame, 80: component, 81: main body portion, 811: front surface, 812: back surface, 813: side surface, 82: (pair of) terminals (feature portion), 85: reference feature portion, 86: candidate feature portion, 87: second reference feature portion, 88: second candidate feature portion, 91: board, As: supply area, Nf: number of feature portions, Ns: number of candidate feature portions, Ns2: number of second candidate feature portions, Pm: measurement point.

The invention claimed is:

1. A component mounter, comprising:
a camera configured to image a supply area where multiple components are supplied in a bulk state;
an image processing section configured to execute on image data acquired through imaging by the camera image processing for distinguishing areas of multiple feature portions of each of the components from areas other than the multiple feature portions in the image data based on brightness; and
a state recognition section configured to recognize a supply state of each of the components in the supply area based on a feature amount including at least one of a shape and an angle of each of the multiple feature portions of each of the components in the image data on which the image processing is executed,
wherein one of the multiple feature portions in the image data on which the image processing is executed is defined as a reference feature portion, and another of the multiple feature portions which is included in a predetermined search range which is determined based on a position and the feature amount of the reference feature portion is defined as a candidate feature portion which can belong to an identical component of the multiple components together with the reference feature portion, and
wherein the state recognition section determines whether the candidate feature portion belongs to the identical component together with the reference feature portion based on either of the feature amount or feature amounts of one or more the candidate feature portions which are included in the search range and a positional relationship between the reference feature portion and the candidate feature portion.

2. The component mounter according to claim 1,
wherein each of the multiple feature portions of the component has an identical shape, and
wherein when a degree of matching of a shape of the reference feature portion with a shape of the candidate feature portion is equal to or larger than a preset threshold, the state recognition section determines that the candidate feature portion belongs to the identical component together with the reference feature portion.

3. The component mounter according to claim 1,
wherein when a degree of matching of a shape of the candidate feature portion with an ideal shape of the candidate feature portion is equal to or larger than a preset threshold, the state recognition section determines that the candidate feature portion belongs to the identical component together with the reference feature portion.

4. The component mounter according to claim 2,
wherein the state recognition section specifies a shape of each of the multiple feature portions based on a shape of a rectangular frame having a minimum area which is circumscribed on each of the multiple feature portions in the image data on which the image processing has been executed.

5. The component mounter according to claim 1,
wherein the multiple feature portions on the component are formed at an identical angle, and
wherein when a degree of matching of an angle of reference feature portion with an angle of candidate feature portion is equal to or larger than a preset threshold, the state recognition section determines that the candidate feature portion belongs to the identical component together with the reference feature portion.

6. The component mounter according to claim 1,
wherein when a degree of matching of an angle of the candidate feature portion with an ideal angle of the candidate feature portion is equal to or larger than a preset threshold, the state recognition section determines that the candidate feature portion belongs to the identical component together with the reference feature portion.

7. The component mounter according to claim 1,
wherein one of the multiple candidate feature portions included in the search range is defined as a second reference feature portion, another of the multiple feature portions which is included in a predetermined second search range which is determined based on a position and the feature amount of the second reference feature portion is defined as a second candidate feature portion which can belong to the identical component together with the second reference feature portion, and processing for searching for the second candidate feature portion in the second search range is defined as a preliminary candidate search processing, and
wherein the state recognition section
executes repeatedly the preliminary candidate search processing until the number of the feature portions resulting from combining the second reference feature portion and the second candidate feature portion or sections included in the second search range becomes the number of the feature portions formed on the one component when the number of the feature portions resulting from combining the reference feature portion and the candidate feature portions included in the search range exceeds the number of the feature portions formed on the one component, and
determines that the second candidate feature portion detected in the preliminary candidate search processing executed last belongs to the identical component together with the second reference feature portion.

8. The component mounter according to claim 1,
wherein when the number of the feature portions resulting from combining the reference feature portion and the candidate feature portions included in the search range exceeds the number of the feature portions formed on the one component, the state recognition section determines that the multiple candidate feature portions whose feature amounts are closer to ideal amounts belong to the identical component together with reference feature portion.

9. The component mounter according to claim 1,
wherein the state recognition section determines whether an area which is distinguished as constituting the feature portion in the image data on which the image processing has been executed is appropriate to the feature portion based on a surface area of the area.

10. The component mounter according to claim 9,
wherein the state recognition section calculates a surface area of an area which is distinguished as constituting the feature portion in the image data on which the image processing has been executed based on an amount of pixels making up the area.

11. The component mounter according to claim 1,
wherein the state recognition section
deduces positions of one or more measurement points which are located in an area defined between the reference feature portion and the candidate feature portion in the image data on which the image processing has been executed and measures brightness of positions corresponding to the measurement points in the initial image data on which the image processing has not yet been executed,
determines whether the area defined between the reference feature portion and the candidate feature portion constitutes a part of the component based on the brightness so measured, and
determines whether the candidate feature portion belongs to the identical component together with the reference feature portion based on the result of the determination.

12. The component mounter according to claim 1,
wherein the component comprises a main body portion and a pair of terminals provided individually at both ends of the main body portion, wherein brightness of the main body portion is lower than brightness of the pair of terminals in the image data, and
wherein the multiple feature portions on the component are the pair of terminals.

13. The component mounter according to claim 1,
wherein the supply state in the supply area includes at least one of component orientations indicating whether a thickness direction of the component constitutes an up-down direction, a degree of separation indicating whether the multiple components stay closer than a predetermined distance, and a pickup possibility indicating whether the components so staying can be picked up from the supply area.

14. The component mounter according to claim 1,
wherein the component mounter further comprises a setting section configured to set from the multiple components supplied in the supply area the component as a pickup target based on the supply state thereof which is recognized by the state recognition section.

* * * * *